(12) United States Patent
Yanagita et al.

(10) Patent No.: US 6,825,099 B2
(45) Date of Patent: Nov. 30, 2004

(54) METHOD AND APPARATUS FOR SEPARATING MEMBER

(75) Inventors: Kazutaka Yanagita, Kanagawa (JP); Mitsuharu Kohda, Kanagawa (JP); Kiyofumi Sakaguchi, Kanagawa (JP); Akira Fujimoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 318 days.

(21) Appl. No.: 10/178,746

(22) Filed: Jun. 25, 2002

(65) Prior Publication Data

US 2003/0003687 A1 Jan. 2, 2003

(30) Foreign Application Priority Data

Jun. 29, 2001 (JP) ........................................ 2001-199344

(51) Int. Cl.[7] .......................... H01L 21/46; G06F 19/00
(52) U.S. Cl. ...................................... 438/459; 700/121
(58) Field of Search ................................ 438/459, 660, 438/478, 455, 406, 311; 700/121, 13

(56) References Cited

U.S. PATENT DOCUMENTS

| 1,661,672 | A | 3/1928 | Morrison ................... 175/424 |
| 3,924,698 | A | 12/1975 | Juvkam-Wold ............. 175/393 |
| 3,960,407 | A | 6/1976 | Noren .......................... 299/17 |
| 4,119,160 | A | 10/1978 | Summers et al. ............. 175/67 |
| 5,371,037 | A | 12/1994 | Yonehara ..................... 437/86 |
| 5,605,492 | A | 2/1997 | Klingel ......................... 451/40 |
| 6,100,166 | A | 8/2000 | Sakaguchi et al. .......... 438/455 |
| 6,294,478 | B1 | 9/2001 | Sakaguchi et al. .......... 438/753 |
| 6,372,608 | B1 * | 4/2002 | Shimoda et al. ............. 438/455 |
| 6,382,292 | B1 | 5/2002 | Ohmi et al. ................. 156/584 |
| 6,436,226 | B1 | 8/2002 | Omi et al. .................... 156/344 |
| 6,649,492 | B2 * | 11/2003 | Chu et al. ..................... 438/478 |
| 6,653,205 | B2 | 11/2003 | Yanagita et al. ............. 438/455 |
| 2002/0047235 | A1 | 4/2002 | Allner et al. .................. 271/98 |
| 2002/0174958 | A1 | 11/2002 | Yanagita et al. ............. 156/584 |
| 2002/0174959 | A1 | 11/2002 | Yanagita et al. ............. 156/584 |
| 2003/0010445 | A1 | 1/2003 | Yanagita et al. ............. 156/344 |

FOREIGN PATENT DOCUMENTS

| JP | 5-21338 | 1/1993 |
| JP | 11-45840 | 2/1999 |

* cited by examiner

*Primary Examiner*—Evan Pert
*Assistant Examiner*—Monica D. Harrison
(74) *Attorney, Agent, or Firm*—Fitzpatrick, Cella, Harper & Scinto

(57) ABSTRACT

This invention is to appropriately separate a bonded substrate stack regardless of some distortion in the bonded substrate stack or the like. This separating apparatus includes a position adjusting mechanism (140) for adjusting the position of a nozzle (120) which ejects a fluid. A bonded substrate stack (50) is separated while changing the level of the nozzle (120) stepwise by the position adjusting mechanism (140) in accordance with a program which is set in advance on the assumption that the bonded substrate stack (50) has a distortion within a predetermined range.

29 Claims, 13 Drawing Sheets

UNSEPARATED REGION

UNSEPARATED REGION

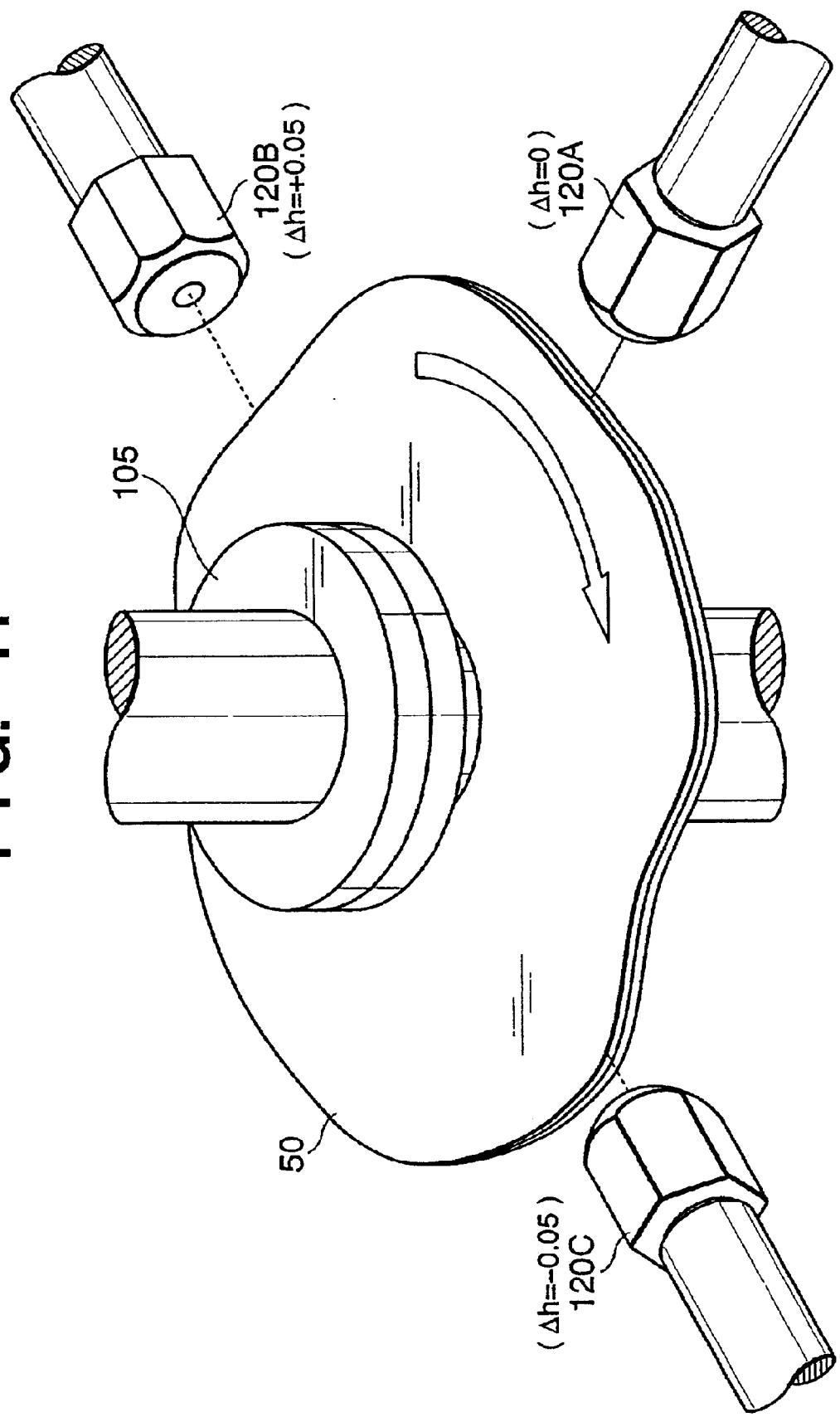

METHOD AND APPARATUS FOR SEPARATING MEMBER

FIELD OF THE INVENTION

The present invention relates to a separating apparatus and processing method for a member such as a bonded substrate stack, a semiconductor substrate manufacturing method, and a semiconductor device manufacturing method.

BACKGROUND OF THE INVENTION

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A fully depleted field effect transistor can be formed by thin film formation.

Since an SOI structure has the above various advantages, researches have been made on its formation method for several decades.

As a method, an SOI structure is formed by bonding a single-crystal Si substrate to another thermally oxidized single-crystal Si substrate by annealing or an adhesive. In this method, an active layer for forming a device must be uniformly thin. More specifically, a single-crystal Si substrate having a thickness of several hundred micron must be thinned down to the micron order or less.

To thin the substrate, polishing or selective etching can be used.

A single-crystal Si substrate can hardly be uniformly thinned by polishing. Especially, in thinning to the submicron order, the variation range is several ten %. As the wafer size becomes large, this difficulty becomes more pronounced.

The present applicant has disclosed a new SOI technique in Japanese Patent Laid-Open No. 5-21338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred-Å to 10-µm thick SOI films can be manufactured by a single manufacturing apparatus.

To separate the bonded first and second substrates into two substrates without breaking the first and second substrates, the following methods are available: the two substrates are pulled in opposite directions while applying a force in a direction perpendicular to the bonding interface; a shearing force is applied parallel to the bonding interface (for example, the two substrates are moved in opposite directions in a plane parallel to the bonding interface, or the two substrates are rotated in opposite directions while applying a force in the circumferential direction); pressure is applied in a direction perpendicular to the bonding interface; a wave energy such as an ultrasonic wave is applied to the separation region; a peeling member (e.g., a sharp blade such as a knife) is inserted into the separation region parallel to the bonding interface from the side surface side of the bonded substrate stack; the expansion energy of a substance filling the pores of the porous layer functioning as the separation region is used; the porous layer functioning as the separation region is thermally oxidized from the side surface of the bonded substrate stack to expand the volume of the porous layer and separate the substrates; and the porous layer functioning as the separation region is selectively etched from the side surface of the bonded substrate stack to separate the substrates.

As a method of separating a bonded substrate stack, the present applicant disclosed an epoch-making technique in Japanese Patent Laid-Open No. 11-45840 (Japanese Patent No. 2,877,800). In the separating method described in Japanese Patent Laid-Open No. 11-45840, a bonded substrate stack having a porous layer or ion implantation layer serving as a separation layer is separated into two substrates by injecting a fluid into the side surface of the bonded substrate.

More specifically, in the separating method described in Japanese Patent Laid-Open No. 11-45840, the bonded substrate stack is held by a pair of holders (substrate holding portions) having a smaller size than that of the bonded substrate stack. A fluid is injected into the side surface of the bonded substrate stack while rotating it, thereby separating the bonded substrate stack into two substrates at the porous layer.

In holding the bonded substrate stack by the pair of holders, which have a size smaller than that of the bonded substrate stack, distortion may occur at the outer portion due to its own weight or the like, or the bonded substrate stack may be held with some distortion which has occurred in the manufacturing process remaining without being corrected. Assume that distortion exists in the bonded substrate stack held by holders. In this case, when a fluid is to be injected throughout the perimeter of the bonded substrate stack while rotating it, the fluid maybe injected to a position deviated from an appropriate position (e.g., a bonding interface or separation layer).

For the sake of easy understanding, an extreme case will be described. For example, if the bonded substrate stack is largely distorted, a fluid ejected from a nozzle, the position of which has been adjusted on the assumption that the bonded substrate stack is not distorted, is not injected into the separation layer or bonding interface of the bonded substrate stack. When this occurs, separation processing may not progress at all. This will be described with reference to FIG. 13.

FIG. 13 is a view showing a state wherein a bonded substrate stack 50 which is largely distorted is separated into two substrates at a separation layer 12. In the example shown in FIG. 13, the position of the actual separation layer 12 largely deviates from that of a separation layer without any distortion (the ideal position of the separation layer). In this case, the position of a nozzle 120 is adjusted on the assumption that the separation layer 12 is arranged at the ideal position. When separation is performed in this state, a fluid from the nozzle 120 is not injected into the separation layer 12, thereby preventing smooth separation. If large distortion exists at the perimeter of the bonded substrate stack 50, separation does not progress speedily. This may result in unsatisfactory separation.

The probability of the above-described unsatisfactory separation would increasingly become higher due to increase in size of a bonded substrate stack along with increase in size of a required SOI substrate.

In addition, in holding a bonded substrate stack by holders, some foreign substance may enter between the bonded substrate stack and holders. In this case as well, a fluid from a nozzle may be injected into a position deviated from the separation layer or bonding interface of the bonded substrate stack.

SUMMARY OF THE INVENTION

The present invention has been made in consideration of the above situation, and has as its object to guarantee that in separating a member having a separation layer such as a bonded substrate stack, the member be appropriately separated regardless of some distortion in the member, insufficient accuracy in holding the member, or the like.

According to the present invention, there is provided a method of separating a member which has a separation layer inside using a jet, characterized by comprising the control step of, halfway through separation processing of the member, changing a positional relationship between a jet orbit and the member in accordance with a program which is set in advance before start of the separation processing.

According to a preferred aspect of the present invention, in the control step, the positional relationship between the jet orbit and the member is preferably changed stepwise in accordance with the program.

According to a preferred aspect of the present invention, the program is preferably a single program which is set in advance to apply to separation of a plurality of members.

According to a preferred aspect of the present invention, in the control step, for example, the jet orbit or a position of the member is changed in a direction perpendicular to the separation layer of the member halfway through the separation processing.

According to a preferred aspect of the present invention, in the control step, for example, a direction of the jet is changed halfway through the separation processing.

According to a preferred aspect of the present invention, in the control step, for example, the positional relationship between the jet orbit and the member is changed halfway through the separation processing by switching an ejecting portion out of a plurality of ejecting portions, which is used to inject a fluid into the member.

According to a preferred aspect of the present invention, for example, this separating method is suitable for separation of the member which has a recessed portion in an outer side of the separation layer and has a distortion within a predetermined range, and in the control step, the positional relationship between the jet orbit and the member is so changed halfway through the separation processing as to cause the jet to strike on the recessed portion almost throughout a perimeter of the recessed portion before the separation processing is complete.

Alternatively, this separating method is suitable for separation of the member which has a recessed portion in an outer side of the separation layer and has a distortion within a predetermined range, and in the control step, a change in the positional relationship between the jet orbit and the member is repeated until the jet strikes on the recessed portion almost throughout a perimeter of the recessed portion.

According to a preferred aspect of the present invention, the control step preferably comprises the step of fixing the positional relationship between the jet orbit and the member after the jet strikes on the recessed portion almost throughout the perimeter of the recessed portion.

According to a preferred aspect of the present invention, the member is preferably rotated about an axis perpendicular to the separation layer during the separation processing.

According to a preferred aspect of the present invention, this separating method is suitable for separation of a bonded substrate stack, obtained by bonding to a handle substrate a seed substrate which has a semiconductor layer on a separation layer through an insulating layer, at the separation layer.

According to a preferred aspect of the present invention, for example, the jet is obtained by ejecting a liquid or gas from an ejecting portion.

According to the present invention, there is provided an apparatus for separating a member which has a separation layer inside using a jet, characterized by comprising a holding portion for holding a member, an ejecting nozzle for forming jets, and a controller for changing, halfway through separation processing of the member held by the holding portion, a positional relationship between an orbit of the jet and the member in accordance with a program which is set in advance.

According to a preferred aspect of the present invention, the controller preferably changes the positional relationship between the jet orbit and the member stepwise in accordance with the program.

According to a preferred aspect of the present invention, the program is preferably a single program which is set in advance to apply to separation of a plurality of members.

According to a preferred aspect of the present invention, for example, the controller changes the jet orbit or a position of the member in a direction perpendicular to the separation layer of the member halfway through the separation processing.

According to a preferred aspect of the present invention, for example, the controller changes a direction of the jet halfway through the separation processing.

According to a preferred aspect of the present invention, for example, the controller changes the positional relationship between the jet orbit and the member halfway through the separation processing by switching an ejecting portion out of a plurality of ejecting portions, which is used to inject a fluid into the member.

According to a preferred aspect of the present invention, this separating apparatus is suitable for separation of the member which has a recessed portion in an outer side of the separation layer and has a distortion within a predetermined range, and the controller preferably so changes the positional relationship between the jet orbit and the member halfway through the separation processing as to cause the jet to strike on the recessed portion almost throughout a perimeter of the recessed portion before the separation processing is complete.

Alternatively, this separating apparatus is suitable for separation of the member which has a recessed portion in an outer side of the separation layer and has a distortion within a predetermined range, and the controller preferably repeats a change in the positional relationship between the jet orbit and the member until the jet strikes on the recessed portion almost throughout the perimeter of the recessed portion.

According to a preferred aspect of the present invention, the controller preferably fixes the positional relationship between the jet orbit and the member after the jet strikes on the recessed portion almost throughout the perimeter of the recessed portion.

According to a preferred aspect of the present invention, this separating apparatus preferably further comprises a rotating mechanism for rotating the member about an axis perpendicular to the separation layer during the separation processing.

According to a preferred aspect of the present invention, this separating apparatus is suitable for separation of a bonded substrate stack obtained by bonding to a handle substrate a seed substrate which has a semiconductor layer on a separation layer through an insulating layer.

According to a preferred aspect of the present invention, for example, the jet is obtained by ejecting a liquid or gas from an ejecting portion.

According to the present invention, there is provided a semiconductor substrate manufacturing method characterized by comprising the steps of forming a bonded substrate stack as a member to be separated by bonding to a second substrate a first substrate which has a separation layer inside and a transfer layer on the separation layer, and separating the bonded substrate stack at the separation layer by using the above separating method.

According to the present invention, there is provided a semiconductor device manufacturing method characterized by comprising the steps of preparing an SOI substrate manufactured using the above manufacturing method, and element-isolating an SOI layer of the SOI substrate and forming a transistor on the element-isolated SOI layer.

The transistor may be a partially depleted FET or fully depleted FET.

According to the present invention, there is provided another method of separating a member which has a separation layer inside using a jet, characterized in that separation is performed using an orbit of a first jet and an orbit of a second jet which are set in advance before separation processing and have positions different from each other in a direction of thickness of the member.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 is a view showing a modification of the separating apparatus shown in FIG. 2;

DETAILED DESCRIPTION OF THE PREFERRED EMBODIMENTS

Figure 1A:
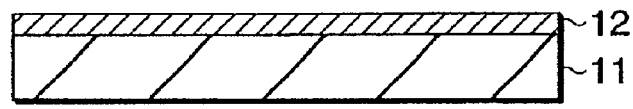
FIGS. 1A to 1E are views for explaining a method of manufacturing a substrate having, e.g., an SOI structure according to a preferred embodiment of the present invention.

Preferred embodiments of the present invention will be described below with reference to the accompanying drawings.

A separating apparatus according to a preferred embodiment of the present invention comprises an ejecting portion (nozzle) and substrate holding portions (holders) for holding a member which has a separation layer inside (e.g., a bonded substrate stack). This separating apparatus changes the position or angle of the ejecting portion or changes the position of the substrate holding portions, halfway through separation processing of the bonded substrate stack held by the substrate holding portions, thereby changing the positional relationship between the orbit of a fluid (jet) ejected from the ejecting portion and the bonded substrate stack, e.g., stepwise. This change can be done in accordance with a program set in advance before the start of the separation processing (i.e., before actual separation of the bonded member progresses). For example, in the first step, a fluid is so ejected as to direct the orbit of a jet toward the bonding interface of the bonded substrate stack. After rotating the substrate stack once or more, in the second step, the jet orbit is changed in the direction of thickness of the substrate stack, and the substrate stack is rotated once or more. Needless to say, the jet orbit may further be changed in the third step. A plurality of nozzles (two or more nozzles), having a first jet orbit and second jet orbit which have been defined in advance before the start of separation processing, and which have different positions in the direction of thickness of a member, may be used.

When three jet orbits are to be used, an orbit extending toward the bonding interface may be defined as a first jet orbit; one shifted by +Δh in the direction of thickness of the substrate stack, a second jet orbit; and one shifted by −Δh, a third jet orbit.

When two jet orbits are to be used, the first jet orbit, which is located at a position shifted from the bonding interface (or separation layer) by +Δh in the direction of thickness of the substrate stack, and a second jet orbit, which is located at a position shifted by −Δh can be used. A value (to be described later) may be used as Δh.

The program is so set as to reliably separate a bonded substrate stack at its separation layer on the assumption that any distortion of the bonded substrate stack, or any shortage of accuracy in holding the bonded substrate stack is within a predetermined range (for example, ±0.1 mm from a designed position). This assumption can appropriately be modified depending on the manufacturing process of the bonded substrate stack or the accuracy in holding the bonded substrate stack. This program is determined as a program which is to be commonly applied to all bonded substrate stacks for a unit (e.g., a lot or a group of single products) in consideration of the manufacturing process of bonded substrate stacks or the like for each unit. A bonded substrate stack to be separated preferably has a recessed portion in its outer side. The positional relationship is so changed as to cause a fluid to be injected into the recessed portion throughout the perimeter of the bonded substrate stack. This recessed portion can be formed by manufacturing a bonded substrate stack using a first substrate (seed wafer) and second substrate (handle wafer), each of which employs a wafer which has a beveling portion with a round sectional shape. If only by bonding, a recessed portion is not formed, or it is not formed satisfactorily enough to cause a fluid to enter the inside of the bonded substrate stack so as to apply separating force to the bonded substrate stack, a recessed portion may be formed in the side surface of the bonded substrate stack by etching or the like. Alternatively, a sharp blade or the like may be inserted into the side surface.

Note that a change width Δh of a jet orbit in the direction of thickness of a bonded member can be set within a range between 10 μm to 100 μm, and preferably 25 μm to 75 μm with respect to the position of its bonding interface (or separation layer) as a reference. In the following description, an example wherein the change width is set to be 50 μm, i.e., 0.05 mm is shown. Needless to say, the above change width can be applied.

The jet orbit in the horizontal direction of the bonded substrate stack may be directed toward the center of the bonded substrate stack, or may not be directed toward the center. To separate the outer portion of the bonded substrate stack more efficiently, the orbit is preferably directed to a direction deviated from the center of the bonded substrate stack.

Figure 2:
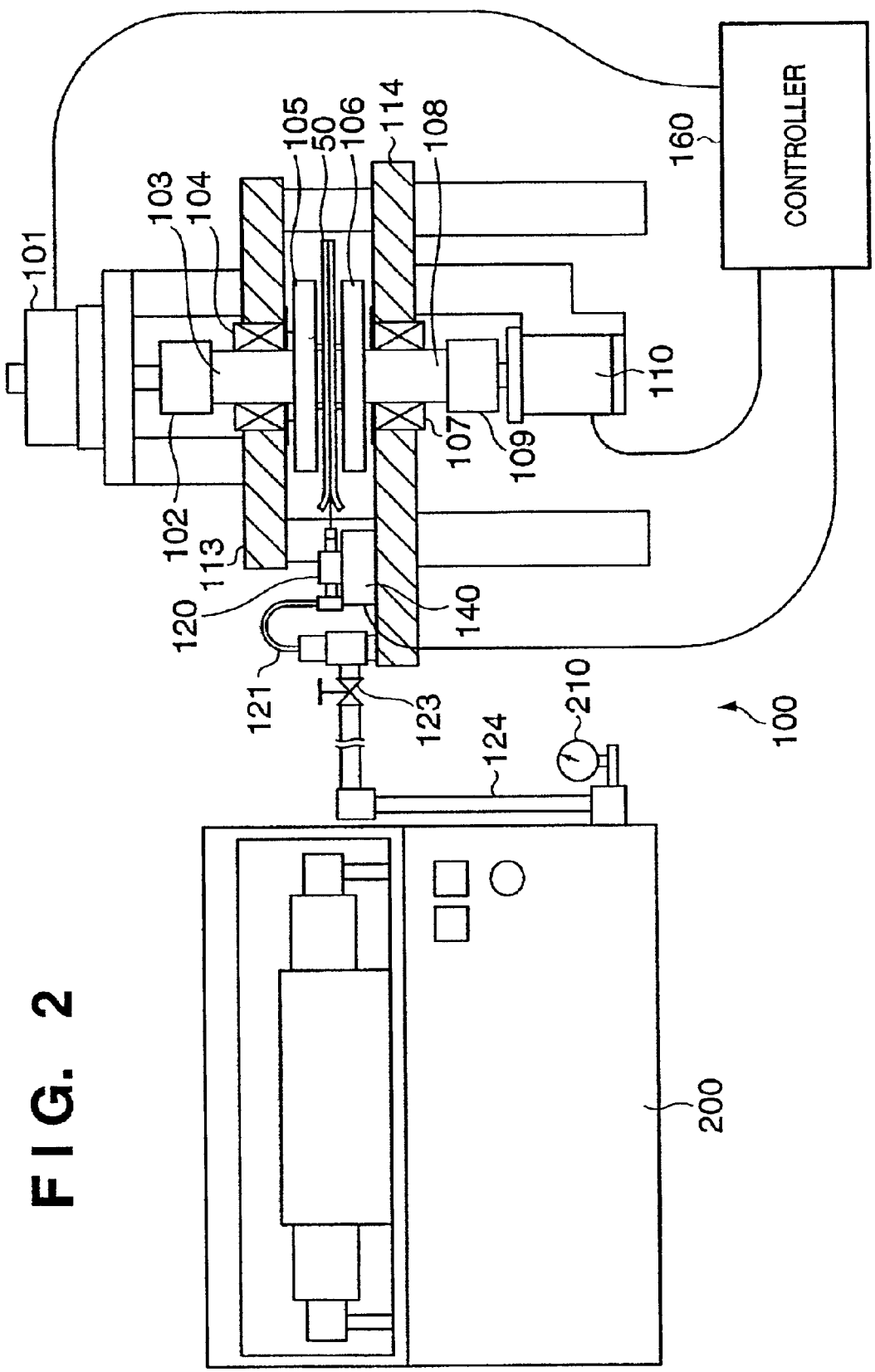
FIG. 2 is a view showing the arrangement of a separating apparatus according to a preferred embodiment of the present invention.

FIG. 2 is a view showing the arrangement of a separating apparatus according to a preferred embodiment of the present invention. A separating apparatus 100 horizontally holds a bonded substrate stack 50 as a plate member to be separated and ejects a fluid (e.g., a liquid such as water, or a gas such as air) toward the outer side of the bonded substrate stack 50 while rotating it, thereby separating the bonded substrate stack 50 into two substrates at a porous layer (separation layer).

The bonded substrate stack 50 is held by a pair of substrate holding portions 105 and 106 which have a common central axis. The bonded substrate stack 50 may be held by a chuck mechanism provided in the pair of substrate holding portions 105 and 106 or clamped by the pair of substrate holding portions 105 and 106.

The upper substrate holding portion 105 is connected to a motor 101 through a rotating shaft 103 and coupling 102. The rotational speed of the motor 101 is arbitrarily controlled by a controller 160. The rotating shaft 103 is axially supported by an upper table 113 through a bearing 104.

The lower substrate holding portion 106 is connected to an air cylinder 110 through a rotating shaft 108 and coupling 109. Hence, the lower substrate holding portion 106 is vertically moved by the air cylinder 110. The air cylinder 110 is driven to set the bonded substrate stack 50 in the separating apparatus 100 and detach the separated substrates from the separating apparatus 100. The air cylinder 110 can also be driven to apply a press force or tensile force (when the bonded substrate stack is chucked) to the bonded substrate stack 50 as needed in separation processing. The air cylinder 110 is controlled by the controller 160. The rotating shaft 108 is axially supported by a lower table 114 through a bearing 107.

A nozzle (ejecting portion) 120 for ejecting a fluid is arranged on the lower table 114. The position of the nozzle 120 is adjusted, e.g., in a direction (vertical direction) parallel to the axial direction of the bonded substrate stack 50 and/or in a direction (horizontal direction) parallel to the planar direction of the bonded substrate stack 50.

The nozzle 120 is connected to the outlet of a servo-driven pump 200 through a high-pressure hose 121, valve 123, and high-pressure pipe 124. The servo-driven pump 200 has a pressure gauge 210 for detecting the pressure of the fluid at the outlet. On the basis of the output from the pressure gauge 210, the variation in pressure of the fluid is suppressed within a predetermined value (e.g., 10% of the target pressure).

For example, when a bonded substrate stack 50 may be distorted, or the bonded substrate stack 50 may be held at a position deviated from an ideal position due to some foreign substance between the substrate holding portions and bonded substrate stack 50, a fluid may be injected into a position deviated from the recessed portion of the bonded substrate stack 50. A separating apparatus 100 according to this embodiment solves such a problem in separation processing in the following way. This separating apparatus 100 changes the vertical position (the position in a direction perpendicular to the separation layer of the bonded substrate stack 50) of the nozzle 120 stepwise by the position adjusting mechanism 140 halfway through separation processing. This means changing the positional relationship between the orbit of a fluid (jet) to be ejected from the nozzle 120 and the bonded substrate stack 50 halfway through the separation processing. This change is so performed stepwise for, e.g., each rotation of the bonded substrate stack 50 as to inject a fluid into the recessed portion of the outer portion of the bonded substrate stack 50 throughout its perimeter. The jet orbit may be changed while ejection of the fluid is temporarily stopped. Alternatively, a change in jet orbit (change in nozzle position in the direction of thickness of the member) may be performed at a temporarily reduced pressure. Needless to say, the pressure of a fluid to be ejected in change may be maintained.

Figure 3:
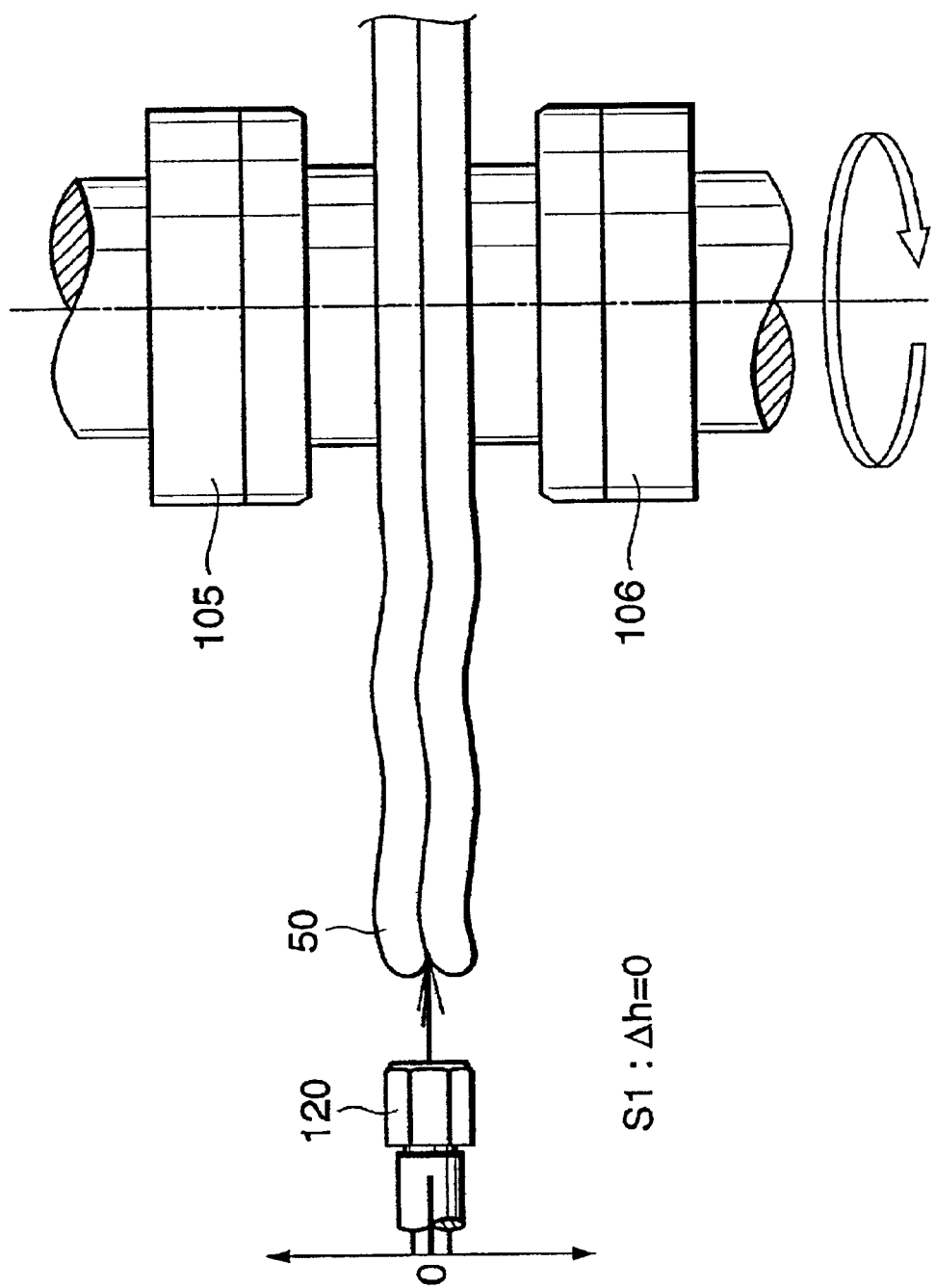
FIG. 3 is a view showing a first-stage separation processing.
Figure 4:
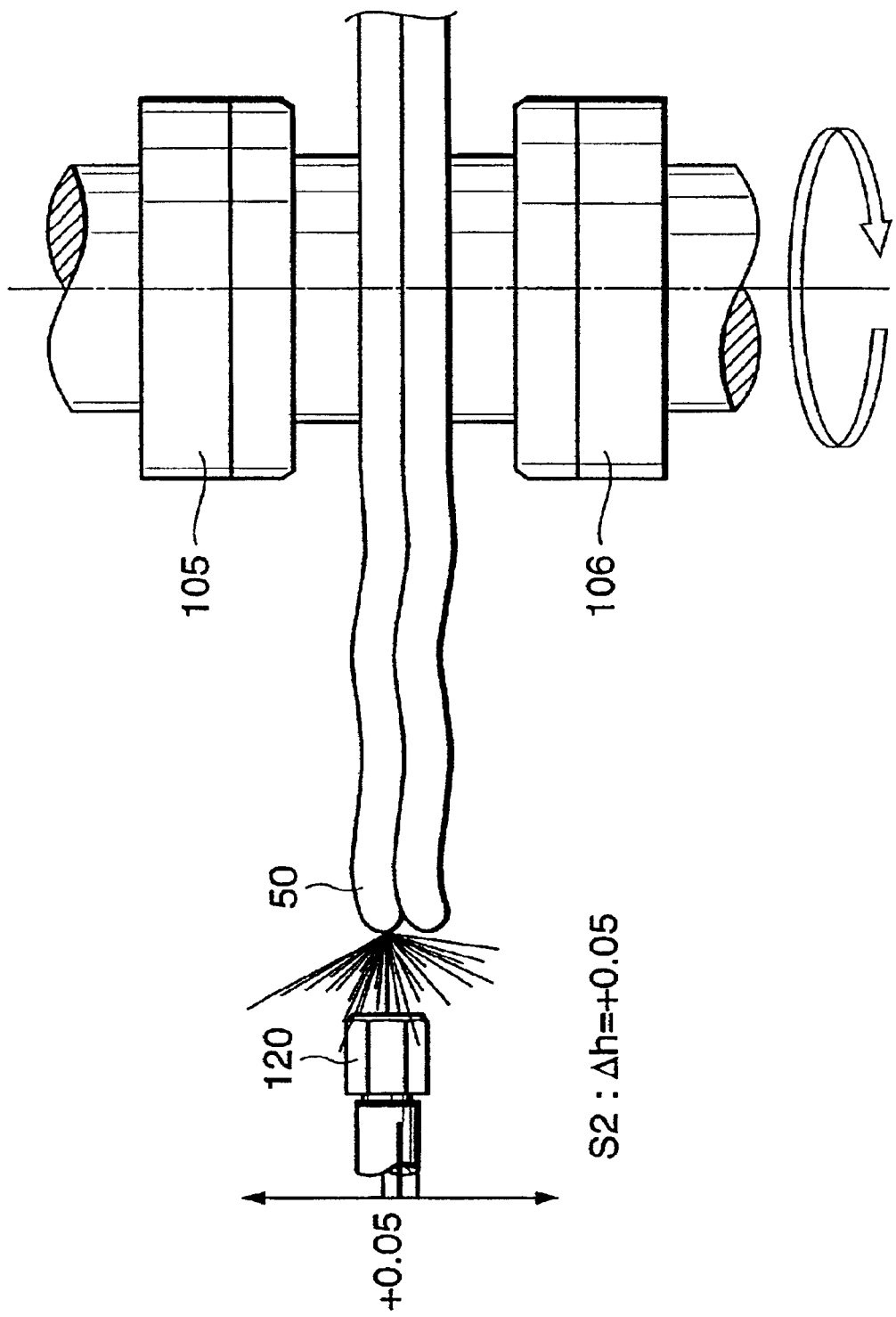
FIG. 4 is a view showing a second-stage separation processing.

An example of a separating method of performing separation processing by changing the position of the nozzle 120 stepwise for each rotation of the bonded substrate stack 50 will be described with reference to FIGS. 3 to 7. FIG. 3 is a view showing first-stage separation processing; FIG. 4, second-stage separation processing; and FIG. 5, third-stage separation processing. FIG. 6 is a view showing the progress of separation of the bonded substrate stack 50 after the second-stage separation processing; and FIG. 7, the progress of separation of the bonded substrate stack 50 after the third-stage separation processing. In this example, the outer portion of the bonded substrate stack 50 is separated throughout its perimeter in the first-stage processing to third-stage separation processing, and the bonded substrate stack 50 is separated into two substrates at the entire region of the separation layer in the subsequent separation processing. Note that the controller 160 controls separation processing in accordance with a program which is set in advance on the assumption that any distortion in a bonded substrate stack to be separated is within a predetermined range in the following processing.

First, in the first-stage separation processing (S1), the vertical position of the nozzle 120 is positioned at a reference level (reference position) under the control of the controller 160, as shown in FIG. 3. The reference level can be considered as a level of the nozzle 120 at which the nozzle 120 can inject a fluid into the recessed portion (especially, the bonding interface or separation layer) of the bonded substrate stack 50 without any distortion when the substrate holding portions 105 and 106 appropriately hold the bonded substrate stack. In FIG. 3, the reference level is described as "Δh=0". The first-stage separation processing separates the bonded substrate stack 50 with some distortion at, e.g., a portion indicated by S1 in FIG. 6. Referring to FIG. 6, the portion other than the portion S1 of the outer portion of the bonded substrate stack 50 is an unseparated portion, which has not been separated because a fluid has not appropriately been injected into the recessed portion in the unseparated portion due to some distortion in the bonded substrate stack 50 or unsatisfactory holding of the bonded substrate stack 50 caused by some foreign substance or the like.

Next, in the second-stage separation processing (S2), the vertical position of the nozzle 120 is positioned at a position (Δh=+0.05 mm) shifted from the reference level (Δh=0) by 0.05 mm in the positive direction (in this case, the upward direction) under the control of the controller 160, as shown in FIG. 4. Note that this displacement amount (Δh=+0.05 mm) can be determined in consideration of the manufacturing process of bonded substrate stacks for each unit (e.g., a lot or a group of single products). This example assures separation processing of at least a bonded substrate stack with a distortion of +0.05 mm from a reference position (designed position). Since, in fact, a fluid ejected from the nozzle 120 has a corresponding diameter (e.g., 0.1 mm), even a bonded substrate stack with a distortion of more than the displacement amount of the nozzle 120 can appropriately be separated as far as the excess amount over the displacement amount is small. The second-stage separation processing separates the bonded substrate stack 50 with some distortion at, e.g., a portion indicated by S2 in FIG. 6. Referring to FIG. 6, the portion other than the portions S1 and S2 of the outer portion of the bonded substrate stack 50 is an unseparated portion, which has not been separated because a fluid has not appropriately been injected into the recessed portion in the unseparated portion due to some distortion in the bonded substrate stack 50 or unsatisfactory holding of the bonded substrate stack 50 caused by some foreign substance or the like.

Figure 5:
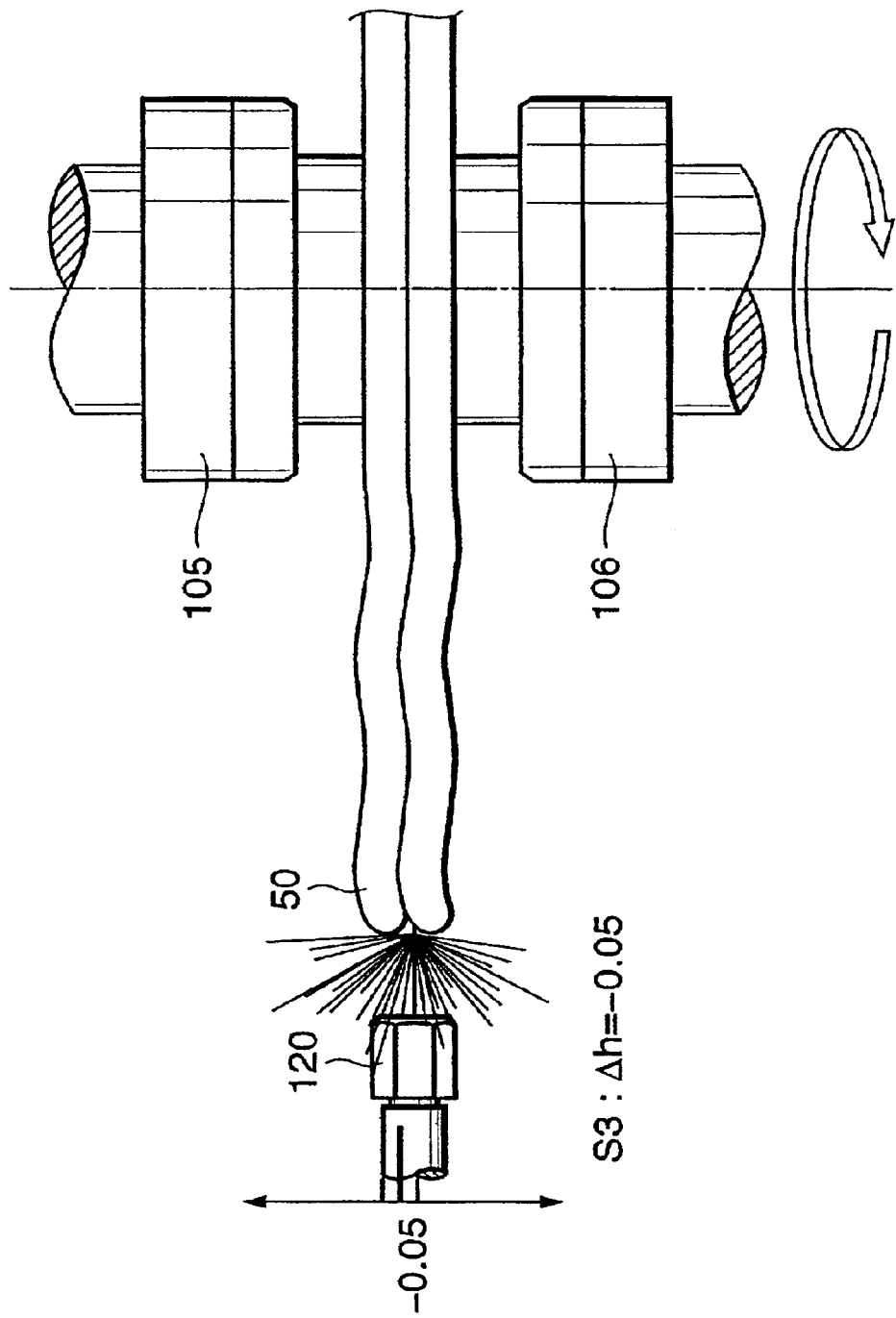
FIG. 5 is a view showing a third-stage separation processing.
Figure 6:
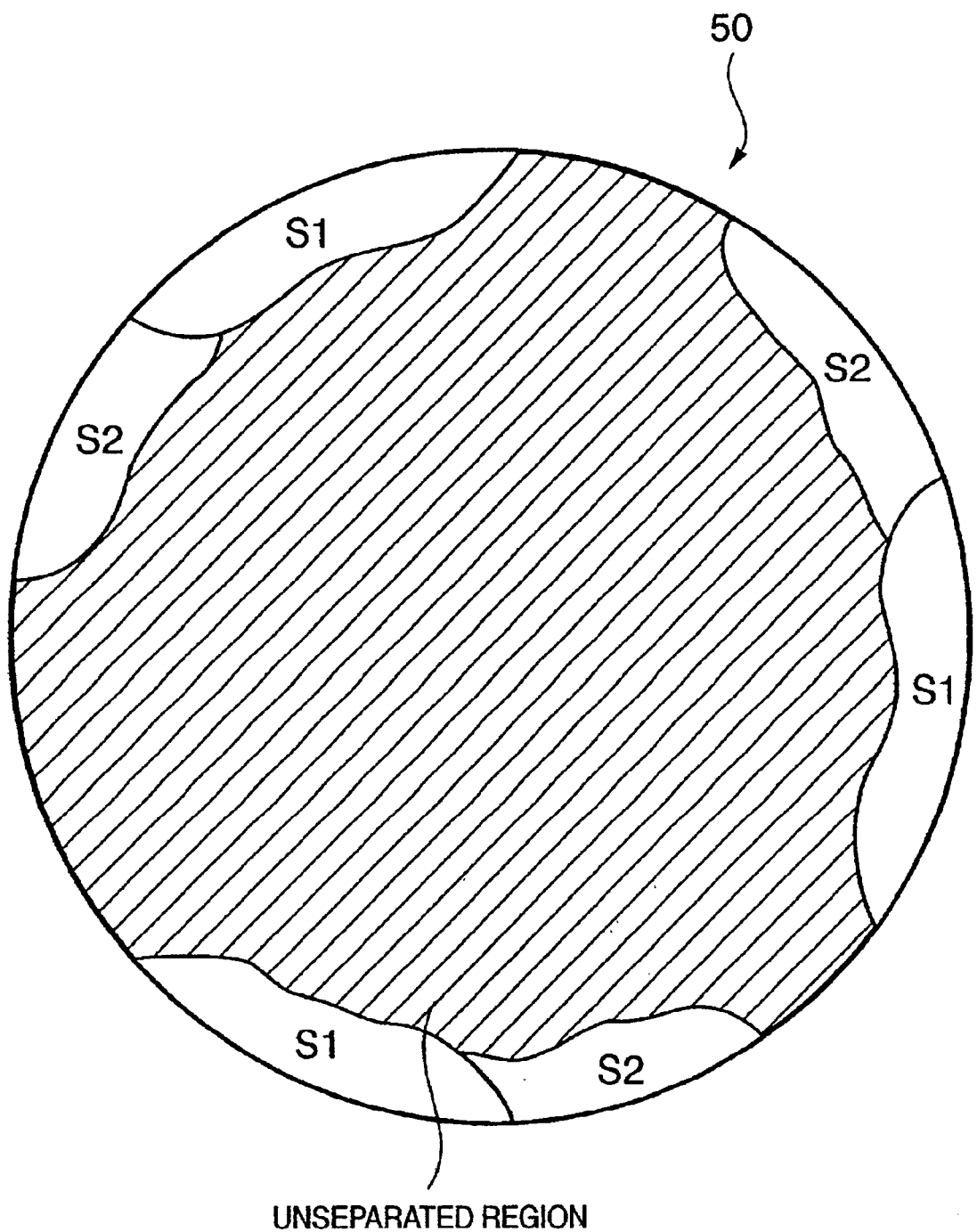
FIG. 6 is a view showing the progress of separation of a bonded substrate stack after the second-stage separation processing.

Then, in the third-stage separation processing (S3), the vertical position of the nozzle 120 is positioned at a position (Δh=−0.05 mm) shifted from the reference level (Δh=0) by 0.05 mm in the negative direction (in this case, the downward direction) under the control of the controller 160, as shown in FIG. 5. The third-stage separation processing separates the bonded substrate stack 50 with some distortion at, e.g., a portion indicated by S3 in FIG. 7. More specifically, the first-stage processing to third-stage processing separate the outer portion of the bonded substrate stack 50 throughout its perimeter.

In the fourth-stage separation processing (S4), the vertical position of the nozzle 120 is typically fixedly positioned at a reference level (reference position) under the control of the controller 160, as shown in FIG. 3. The fourth-stage separation processing may typically be performed without changing the position of the nozzle 120. In this state, the bonded substrate stack 50 is completely separated into two substrates at the entire region of the separation layer. In the fourth-stage separation processing as well, the position of the nozzle 120 may be changed stepwise. Since the outer portion of the bonded substrate stack 50 is separated throughout its perimeter at the fourth stage, a fluid is easily injected into the inside of the bonded substrate stack 50. Additionally, the center portion of the bonded substrate stack 50 is distorted less than the outer portion. In the fourth-stage separation processing, therefore, even if the nozzle 120 is positioned at the reference level, separation can progress without any problems. One or more bonded substrate stacks may be taken out of a lot or a group of products with single specifications of bonded substrate stacks, and any distortion around the taken bonded substrate stacks may be measured to determine the displacement amount.

Figure 8:
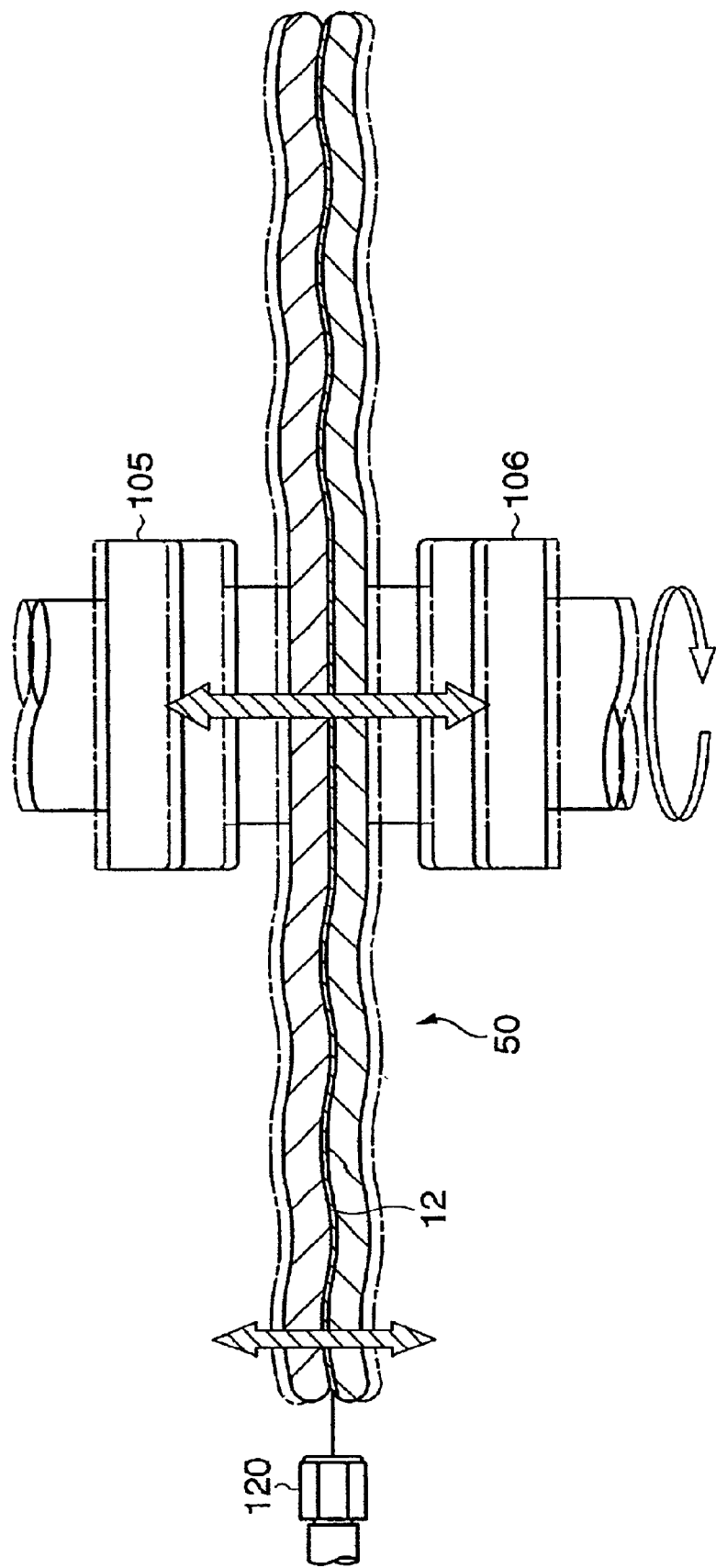
FIG. 8 is a view showing a state wherein a bonded substrate stack is separated while changing the position of substrate holding portions (the bonded substrate stack) in accordance with a program set in advance.

In the separating apparatus 100 shown in FIG. 2, which has been described, the position of the nozzle 120 is changed stepwise in accordance with a program set in advance while keeping the position in the axial direction (perpendicular direction) of the bonded substrate stack 50 fixed. Needless to say, the position of the bonded substrate stack 50 (the substrate holding portions 105 and 106) may be changed stepwise in accordance with a program set in advance while keeping the position of the nozzle 120 fixed in place of changing the position of the nozzle 120, as shown in FIG. 8. Alternatively, the respective positions of the nozzle 120 and bonded substrate stack 50 may be changed, e.g., stepwise.

Figure 9:
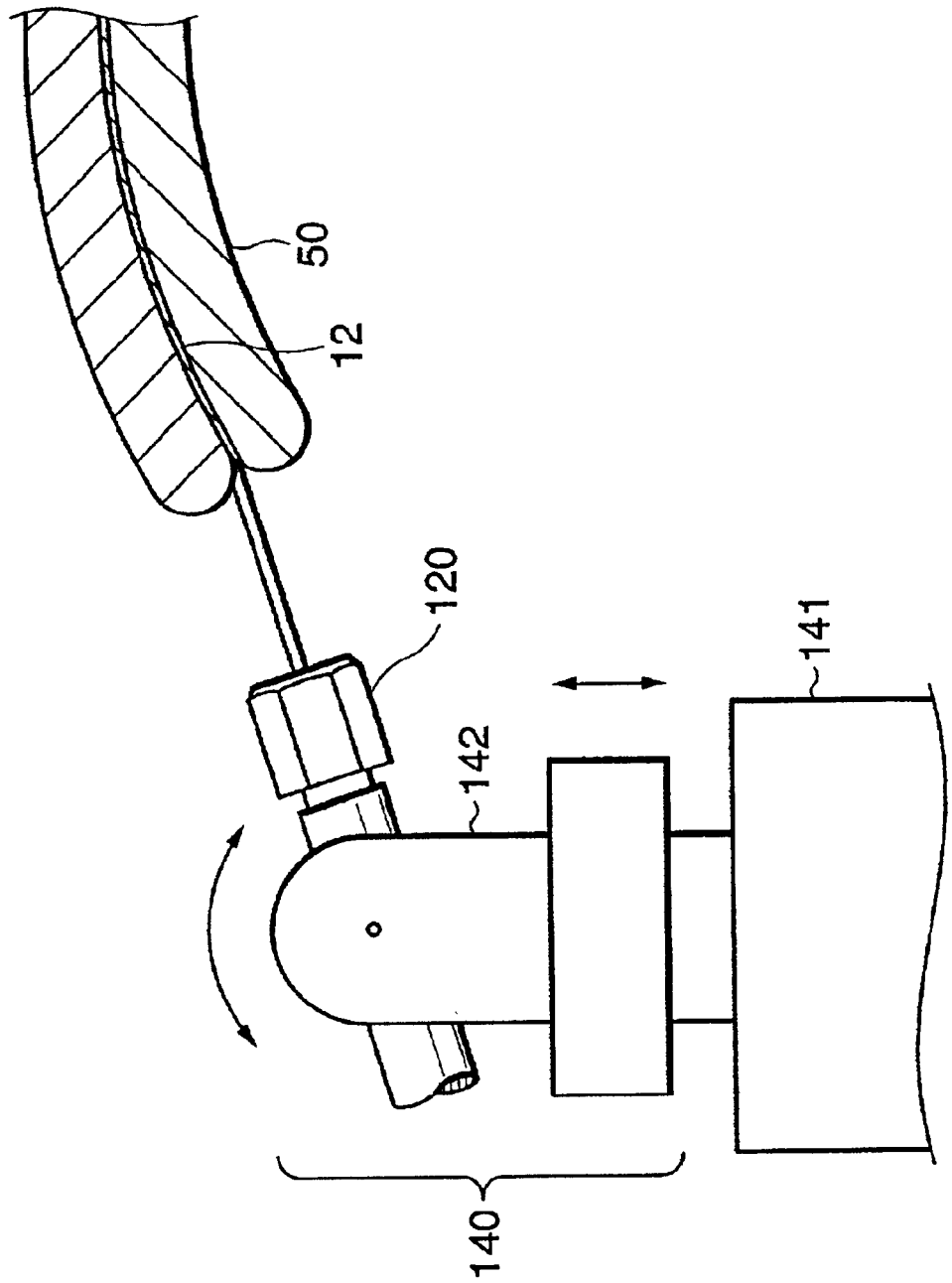
FIG. 9 is a view showing an example of a position adjusting mechanism including a mechanism for adjusting the elevation angle and position of a nozzle.

Alternatively, the elevation angle (or the elevation angle and position) of the nozzle 120 may be changed in accordance with a program set in advance by adding a function of changing the elevation angle of the nozzle 120 to the position adjusting mechanism 140. FIG. 9 is a view showing an example of the position adjusting mechanism 140 comprising a mechanism for adjusting the elevation angle and position of the nozzle 120. The position adjusting mechanism 140 in FIG. 9 includes a first adjusting mechanism 141 for adjusting the vertical position (the position in the planar direction) of the nozzle 120 and a second adjusting mechanism 142 for adjusting the elevation angle of the nozzle 120.

In the separating apparatus 100 shown in FIG. 2, the bonded substrate stack 50 is held horizontally. However, the bonded substrate stack 50 may be held vertically. When the bonded substrate is held horizontally, the bonded substrate stack 50 can easily be transferred to/from other apparatuses.

The overall flow of a separating method using the separating apparatus 100 will be described next.

First, the air cylinder 110 is actuated to move the lower substrate holding portion 106 downward, and the bonded substrate stack 50 is transferred to a predetermined position between the pair of substrate holding portions 105 and 106 by a transfer robot or the like. The air cylinder 110 is actuated to move the lower substrate holding portion 106 upward and cause the pair of substrate holding portions 105 and 106 to hold the bonded substrate stack 50. If the pair of substrate holding portions 105 and 106 have a chuck mechanism, they may be actuated to chuck the bonded substrate stack 50. In addition, a press force or tensile force may be applied to the bonded substrate stack 50 by the air cylinder 110. The bonded substrate stack 50 may be held by applying a press force to the bonded substrate stack 50 by the air cylinder 110 without chucking the bonded substrate stack 50.

Figure 7:
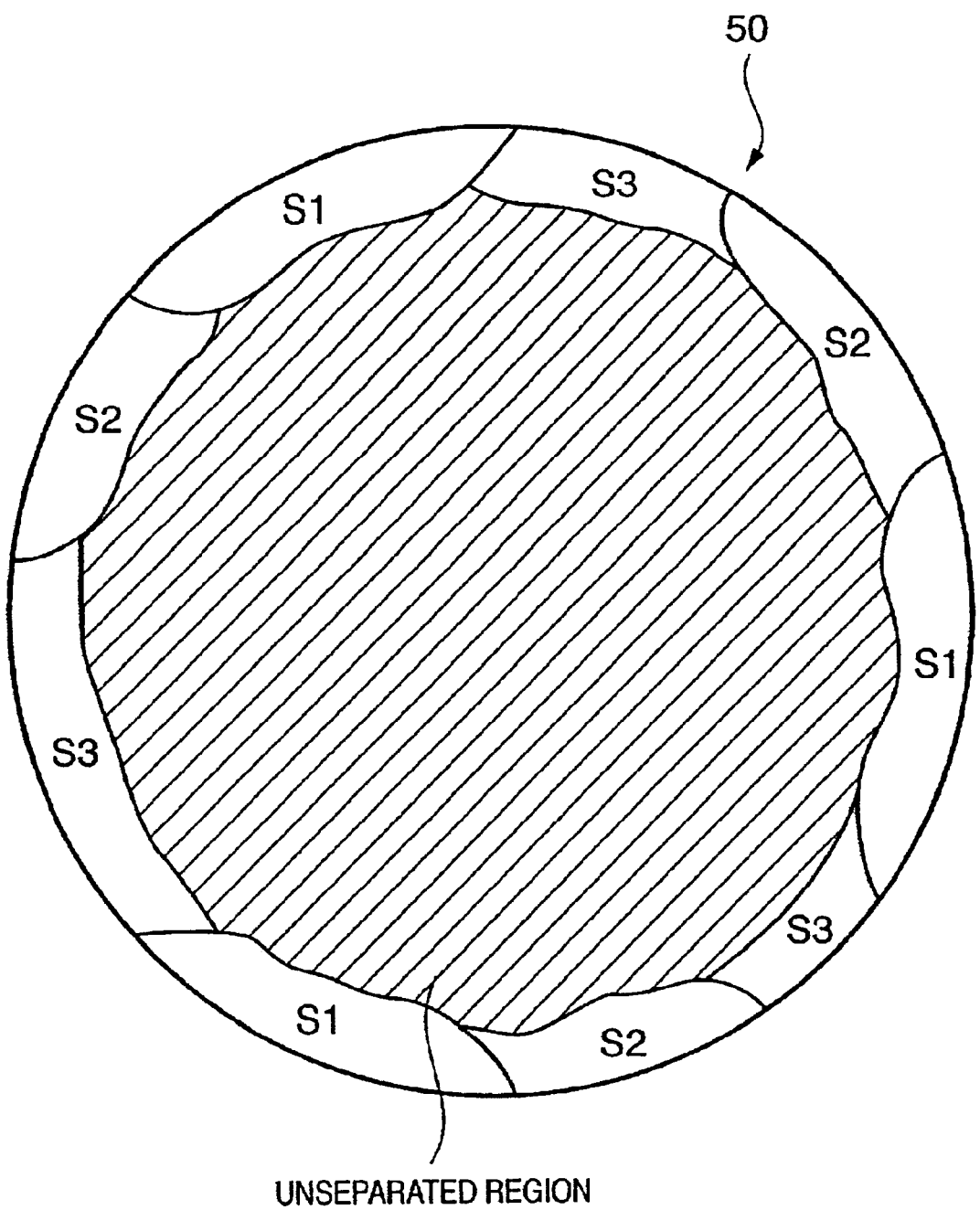
FIG. 7 is a view showing the progress of separation of a bonded substrate stack 50 after the third-stage separation processing.

Next, under the control of the controller 160, the motor 101 is driven while a fluid is ejected from the nozzle 120, thereby rotating the bonded substrate stack 50. Also, at the same time, under the control of the controller 160 as described above, the outer portion of the bonded substrate stack 50 is separated while changing stepwise the positional relationship between the orbit of a fluid (jet) ejected from the nozzle 120 and the bonded substrate stack 50. With this processing, the outer portion of the bonded substrate stack 50 is separated throughout its perimeter, as shown in FIG. 7, for example, even if the bonded substrate stack 50 has a distortion within a predetermined range.

The bonded substrate stack 50 is separated into two substrates completely to the center, typically after the outer portion is separated throughout its perimeter and then the bonded substrate stack 50 is rotated several times.

After the bonded substrate stack 50 is separated, the air cylinder 110 is actuated to move the lower substrate holding portion 106 downward. The two separated substrates are received from the substrate holding portions 105 and 106 by, e.g., a transfer robot.

Figure 10:
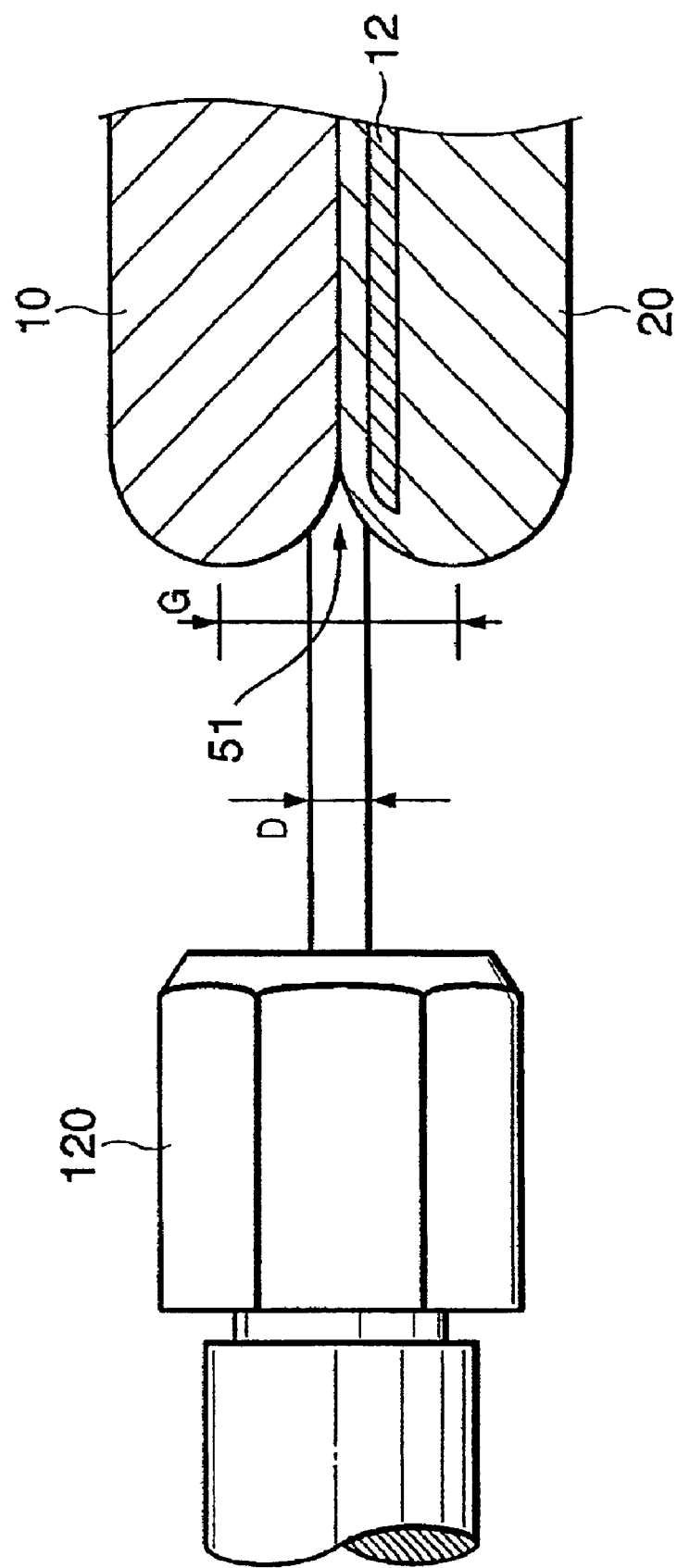
FIG. 10 is an enlarged view of the nozzle and bonded substrate stack (outer portion)

FIG. 10 is an enlarged view of the nozzle 120 and bonded substrate stack (outer portion) 50. As shown in FIG. 10, the bonded substrate stack 50 to be separated preferably has a γ-shaped recessed portion 51 in its section. Forming the recessed portion 51 in the bonded substrate stack 50 enables a fluid from the nozzle 120 to be efficiently injected to the porous layer 12, thus resulting in smooth separation at the porous layer 12. As described previously, this recessed portion 51 forms when a bonded substrate stack is formed using a first substrate (seed wafer) and second substrate (handle wafer), each of which is a general wafer that has a beveling portion with a round sectional shape.

Preferably, each of the first and second substrates 10 and 20 constituting the bonded substrate stack 50 has a thickness of 100 to 2,000 µm and, typically, about 700 µm. A width G of the recessed portion 51, which is formed when each of the first and second substrates 10 and 20 has a thickness of 700 µm, is about 700 µm. Preferably, a diameter D of a fluid to be ejected from the nozzle 120 is about 50 to 1,000 µm and, typically, about 100 µm. At this time, the diameter (width) D of the fluid is preferably ⅟₂₀ to ½ the width G of the recessed portion 51.

FIG. 11 is a view showing a modification of the separating apparatus shown in FIG. 2. In FIG. 11, only the substrate holding portions and nozzles are shown. The other components are the same as those of the separating apparatus shown in FIG. 2.

The separating apparatus shown in FIG. 11 comprises a plurality of nozzles 120A to 120C. The plurality of nozzles 120A to 120C may have positions different from each other in a direction (vertical direction) perpendicular to the separation layer of the bonded substrate stack 50. More specifically, the nozzle 120A is arranged at a position with a reference level (Δh=0). The nozzle 120B is arranged at a position (Δh=+0.05 mm) shifted from the reference level by a predetermined distance (in this case, 0.05 mm) in the positive direction, and the nozzle 120C is arranged at a position (Δh=−0.05 mm) shifted from the reference level by a predetermined distance (in this case, 0.05 mm) in the negative direction. The positions of the plurality of nozzles 120A to 120c may be adjusted respectively by the same position adjusting mechanisms as the above-described position adjusting mechanism 140 as needed (for example, in accordance with a program).

In this modification, under the control of the controller 160, in the first-stage separation processing (S1), the outer portion of the bonded substrate stack 50 is separated while selectively ejecting a fluid from the nozzle 120A, and in the second-stage separation processing (S2), the outer portion of the bonded substrate stack 50 is separated while selectively ejecting the fluid from the nozzle 120B. In the third-stage separation processing (S3), the outer portion of the bonded substrate stack 50 is separated while selectively ejecting the fluid from the nozzle 120C. With these separation processing, the outer portion of the bonded substrate stack 50 is separated throughout its perimeter. Note that a fluid may be ejected simultaneously from the above three nozzles in place of selectively ejecting the fluid from the plurality of nozzles.

In the fourth-stage of separation processing, a fluid is typically ejected from the nozzle 120A to completely separate the bonded substrate stack 50 at the entire area of the separation layer under the control of the controller 160.

Note that in the present invention, a liquid such as water or an etchant, a gas such as air, nitrogen or argon, a fluid mixture of liquid and gas, or the like may be used as a fluid.

Next, a method of manufacturing a substrate will be described as an application of the above separating method. FIGS. 1A to 1E are views for explaining a method of manufacturing a substrate having, e.g., an SOI structure according to a preferred embodiment of the present invention.

In the step shown in FIG. 1A, a single-crystal Si substrate 11 to be used to form a first substrate (seed wafer) 10 is prepared, and a porous Si layer 12 serving as a separation layer is formed on the major surface of the single-crystal Si substrate 11. The porous Si layer 12 can be formed by, e.g., anodizing the single-crystal Si substrate 11 in an electrolyte solution (anodizing solution).

As the electrolyte solution, for example, a solution containing hydrogen fluoride, a solution containing hydrogen fluoride and ethanol, a solution containing hydrogen fluoride and isopropyl alcohol, or the like can be used. More specifically, as the electrolyte solution, for example, a solution mixture containing an HF aqueous solution (HF concentration=49 wt %) and ethanol at a volume ratio of 2:1 can be used.

The porous Si layer 12 may have a multilayered structure including two or more layers with different porosities. The porous Si layer 12 having a multilayered structure preferably includes a first porous Si layer with a first porosity on the surface side, and, under the first porous Si layer, a second porous Si layer with a second porosity higher than the first porosity. With such a multilayered structure, a non-porous layer 13 free from defects can be formed on the first porous Si layer in the step of forming the non-porous layer 13 later, and a bonded substrate stack can be separated at a desired position in the separation step later. The first porosity is preferably 10% to 30% and, more preferably, 15% to 25%. The second porosity is preferably 35% to 70% and, more preferably, 40% to 60%.

When the above solution mixture (49 wt % hydrofluoric acid: ethanol=2:1) is used as the electrolyte solution, preferably, for example, the first layer (surface side) is formed at a current density of 8 mA/cm$^2$ for a process time of 5 to 11 min, and the second layer (inner surface side) is formed at a current density of 23 to 33 mA/cm$^2$ for a process time of 80 sec to 2 min.

Next, at least one of the following steps (1) to (4) is preferably executed. The steps (1) and (2) are preferably executed in this order. More preferably, the steps (1), (2), and (3), or (1), (2), and (4) are executed in this order. Most preferably, the steps (1), (2), (3), and (4) are executed in this order.

(1) Step of Forming Protective Film on Porous Walls in Porous Si Layer (Pre-Oxidation Step)

In this step, a protective film such as an oxide film or nitride film is formed on the porous walls in the porous Si layer 12, thereby preventing any increase in porous size by subsequent annealing. The protective film can be formed by performing annealing in an oxygen atmosphere (preferably at, e.g., 200° C. to 700° C., and more preferably at 300° C. to 500° C.). After that, the oxide film or the like formed on the surface of the porous Si layer 12 is preferably removed. This can be done by, e.g., exposing the surface of the porous Si layer 12 to a solution containing hydrofluoric acid.

(2) Hydrogen Baking Step (Pre-Baking Step)

In this step, the first substrate 10 on which the porous Si layer 12 is formed is annealed in a reduction atmosphere containing hydrogen at 800° C. to 1,200° C. With this annealing, pores on the surface of the porous Si layer 12 can be sealed to some extent. If a native oxide film is present on the surface of the porous Si layer 12, it can be removed.

(3) Trace Material Supply Step (Pre-Injection Step)

When the non-porous layer 13 is to be grown on the porous Si layer 12, it is preferably grown at a low speed by supplying a trace amount of raw material substance of the non-porous layer 13 at the initial stage of growth. With this growing method, atomic migration on the surface of the porous Si layer 12 is promoted, and pores on the surface of the porous Si layer 12 can be sealed. More specifically, the supply of the raw material is controlled such that the growth rate becomes 20 nm/min or less, preferably 10 nm/min or less, and more preferably, 2 nm/min or less.

(4) High-Temperature Baking Step (Intermediate Baking Step)

When annealing is executed in a reduction atmosphere containing hydrogen at a temperature higher than that in the above hydrogen baking step and/or trace material supply step, further sealing and flattening of the porous Si layer 12 can be realized.

Figure 1B:
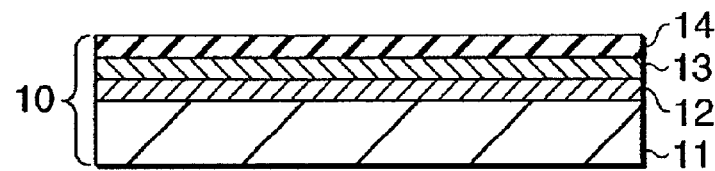

At the first stage of the step shown in FIG. 1B, the first non-porous layer 13 is formed on the porous Si layer 12. As the first non-porous layer 13, an Si layer such as a single-crystal Si layer, poly-Si layer, or amorphous Si layer, Ge layer, SiGe layer, SiC layer, C layer, GaAs layer, GaN layer, AlGaAs layer, InGaAs layer, InP layer, or InAs layer can be used. Needless to say, layers made of the above-described materials may be used in combination as the first non-porous layer 13, as needed. For example, a non-porous single-crystal Si layer may be formed on the porous Si layer 12, a SiGe layer may be formed on the non-porous single-crystal Si layer, and one more non-porous single-crystal Si layer may be formed on the SiGe layer.

At the second stage of the step shown in FIG. 1B, an $SiO_2$ layer (insulating layer) 14 as the second non-porous layer is formed on the first non-porous layer 13. With this process, the first substrate 10 is obtained. The $SiO_2$ layer 14 can be formed, e.g., in an $O_2/H_2$ atmosphere at 1,100° C. for 10 to 33 min.

Figure 1C:
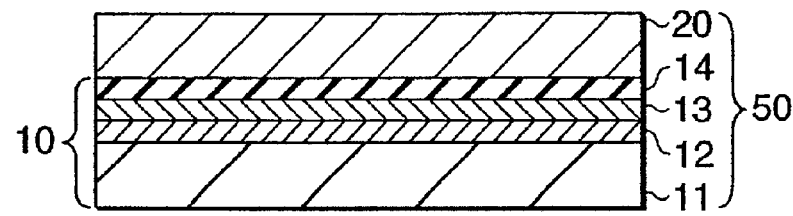

In the step shown in FIG. 1C, a second substrate (handle wafer) 20 is prepared and brought into tight contact with the first substrate 10 at room temperature while making the insulating layer 14 face the second substrate 20, thereby forming a bonded substrate stack 30.

The insulating layer 14 can be formed either on the single-crystal Si layer 13 side, or on the second substrate 20, or on both the single-crystal Si layer 13 and the second substrate 20 as long as the state shown in FIG. 1C is obtained when the first and second substrates are brought into tight contact with each other. However, when the insulating layer 14 is formed on the first non-porous layer (e.g., a single-crystal Si layer) 13 side serving as an active layer, as described above, the bonding interface between the first substrate 10 and the second substrate 20 can be separated from the active layer, and a semiconductor substrate such as an SOI substrate with a higher quality can be obtained.

After the substrates 10 and 20 are completely brought into tight contact, processing of strengthening bonding between the substrates is preferably executed. As an example of this processing, processing of, e.g., 1) executing annealing in an $N_2$ atmosphere at 1,100° C. for 10 min and 2) executing annealing (oxidation) in an $O_2/H_2$ atmosphere at 1,100° C. for 50 to 100 min is preferably performed. In addition to this processing, or in place of this processing, anodic bonding and/or compression may be executed.

As the second substrate 20, an Si substrate, a substrate obtained by forming an $SiO_2$ layer on an Si substrate, a transparent substrate formed from quartz or the like, or a sapphire substrate can be used. However, a substrate of another type which has a sufficiently flat surface to be bonded may be used as the second substrate 20.

Figure 1D:
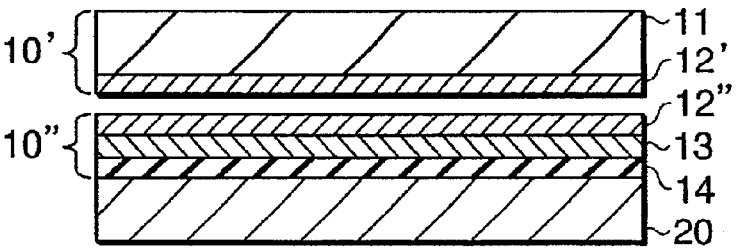

In the step shown in FIG. 1D, the bonded substrate stack 30 is separated at the fragile porous layer 12 with a low mechanical strength using the above-described separating method.

Figure 1E:
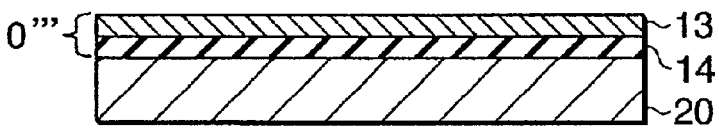

In the step shown in FIG. 1E, a porous layer 12" on the first non-porous layer 13 of the separated second substrate 20 is selectively removed by etching or the like.

A porous layer 12' on the single-crystal Si substrate 11 of a separated first substrate 10' is selectively removed by etching or the like. The single-crystal Si substrate 11 obtained in this way can be reused as a substrate for forming the first substrate 10 or as the second substrate 20.

As a bonded substrate stack, a substrate prepared by the following method may be employed. First, a semiconductor substrate represented by a single-crystal Si substrate such as a mirror wafer or epitaxial wafer is prepared. An insulating film such as a thermal silicon oxide film is formed on the surface of the substrate, as needed. Next, ions such as positive or negative hydrogen ions or rare gas ions are implanted into the substrate by ion implantation using a line beam or plasma immersion, thereby forming a relatively heavily doped ion implantation layer serving as a separation layer at a predetermined depth from the surface. The first substrate is obtained in the above manner.

Next, the second substrate is prepared according to the same procedure as described above and bonded to the first substrate in accordance with the above-described bonding method. With this process, a bonded substrate stack having a layer to be transferred (transfer layer) inside can be obtained.

The ion implantation layer is distorted or contains defects or pores formed from microcavities due to the implanted ions. Such an ion implantation layer has a relatively low mechanical strength and therefore functions as a separation layer. Note that the bonded substrate stack may be separated using a fluid as described above after annealing to the extent that the bonded substrate stack is not completely separated. In this case, annealing can enhance the bonding force in the bonding interface.

Even if the separation layer is not exposed to the outer portion of the bonded substrate stack, a tensile force is applied to the separation layer by ejecting the fluid into the bonded substrate stack, and thus the bonded substrate stack is separated at the separation layer.

A separating apparatus according to a preferred embodiment of the present invention is useful for separating a bonded substrate stack (an example of a member to be separated) which has a separation layer such as a porous layer formed by anodization or an ion implantation layer formed by ion implantation into two substrates at the separation layer. In FIG. 1D, it is shown that separation occurs inside the separation layer. However, the bonded substrate stack may be separated at the interface between the porous Si layer 12 and non-porous layer 13, and/or the interface between the single-crystal Si substrate 11 and porous Si layer 12. Needless to say, it is also preferable to separate the bonded substrate stack almost at the interface between the porous Si layer 12 and non-porous layer 13 by controlling by controlling, e.g., the layer structure of the separation layer. Preferably, the surface of the non-porous layer 13 which has been transferred onto the second substrate is planarized by polishing and/or annealing (hydrogen annealing) in an atmosphere containing hydrogen, as needed.

EXAMPLE OF SEMICONDUCTOR DEVICE

A semiconductor device using a semiconductor substrate that can be manufactured by the above substrate manufacturing method (FIGS. 1A to 1E) and a method of manufacturing the device will be described next with reference to FIGS. 12A to 12D.

FIGS. 12A to 12D are sectional views showing a method of manufacturing a semiconductor device using a semiconductor substrate that can be manufactured using the substrate manufacturing method according to the preferred embodiment of the present invention.

First, an SOI substrate which has a semiconductor layer as a non-porous layer 13 and an insulating layer as a non-porous layer 14 is manufactured using the above substrate manufacturing method. An active region 13' where a transistor is to be formed and an element isolation region 54 are formed by a method of patterning the non-porous semiconductor layer (SOI layer) 13 on the buried insulating layer 14 into an island shape or an oxidation method called LOCOS (FIG. 12A).

Figure 12A:
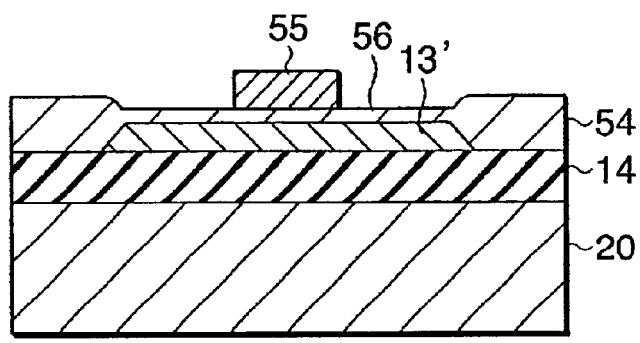
FIGS. 12A to 12D are sectional views showing a method of manufacturing a semiconductor device using a semiconductor substrate that can be manufactured using the substrate manufacturing method according to a preferred embodiment of the present invention.

Next, a gate insulating film 56 is formed on the surface of the SOI layer (FIG. 12A). Examples of the material of the gate insulating film 56 are silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, and a glass mixture thereof. The gate oxide film 56 can be formed by, e.g., oxidizing the surface of the SOI layer or depositing an appropriate substance on the surface of the SOI layer by CVD or PVD.

A gate electrode 55 is formed on the gate insulating film 56 (FIG. 12A). The gate electrode 55 can be formed from, e.g., polysilicon doped with a p- or n-type impurity, a metal such as tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate insulating film 56 may be formed by stacking a plurality of layers formed from different materials, like a polycide gate. The gate electrode 55 can be formed either by, e.g., a method called Salicide (self-align silicide) or by a method called a damascene gate process, or by any other method. With the above process, a structure shown in FIG. 12A is obtained.

Figure 12B:
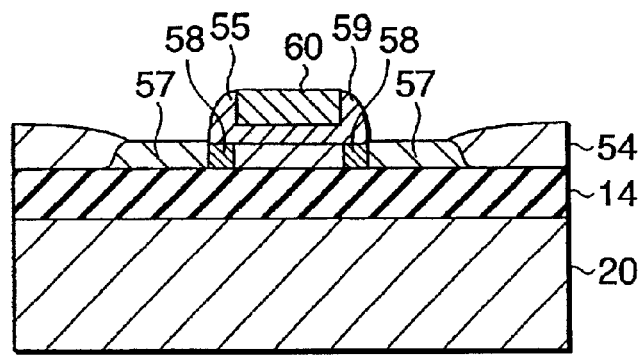

Next, an n-type impurity such as phosphor, arsenic, or antimony or a p-type impurity such as boron is doped into the active region 13', thereby forming relatively lightly-doped source and drain regions 58 (FIG. 12B). The impurity can be doped by, e.g., ion implantation and annealing.

An insulating film is formed to cover the gate electrode 55 and then etched back, thereby forming a side wall 59 on the side surface of the gate electrode 55.

An impurity having the same conductivity type as described above is doped into the active region 13' again, thereby forming relatively heavily-doped source and drain regions 57. With the above process, a structure shown in FIG. 12B is obtained.

Figure 12C:
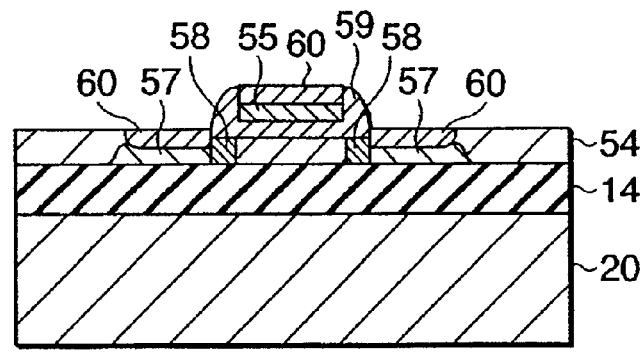

A metal silicide layer 60 is formed on the upper surface of the gate electrode 55 and on the upper surfaces of the source and drain regions 57. Examples of the material of the metal silicide layer 60 are nickel silicide, titanium silicide, cobalt silicide, molybdenum silicide, and tungsten silicide. Such a silicide can be formed by depositing a metal on the upper surface of the gate electrode 55 and on the upper surfaces of the source and drain regions 57, performing annealing to cause the metal to react with underlying silicon, and removing an unreacted portion of the metal using an etchant such as sulfuric acid. The surface of the silicide layer may be nitrided as needed. With the above process, a structure shown in FIG. 12C is obtained.

Figure 12D:
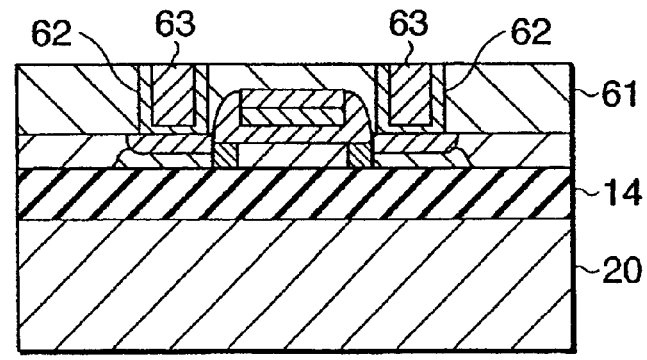
Figure 13:
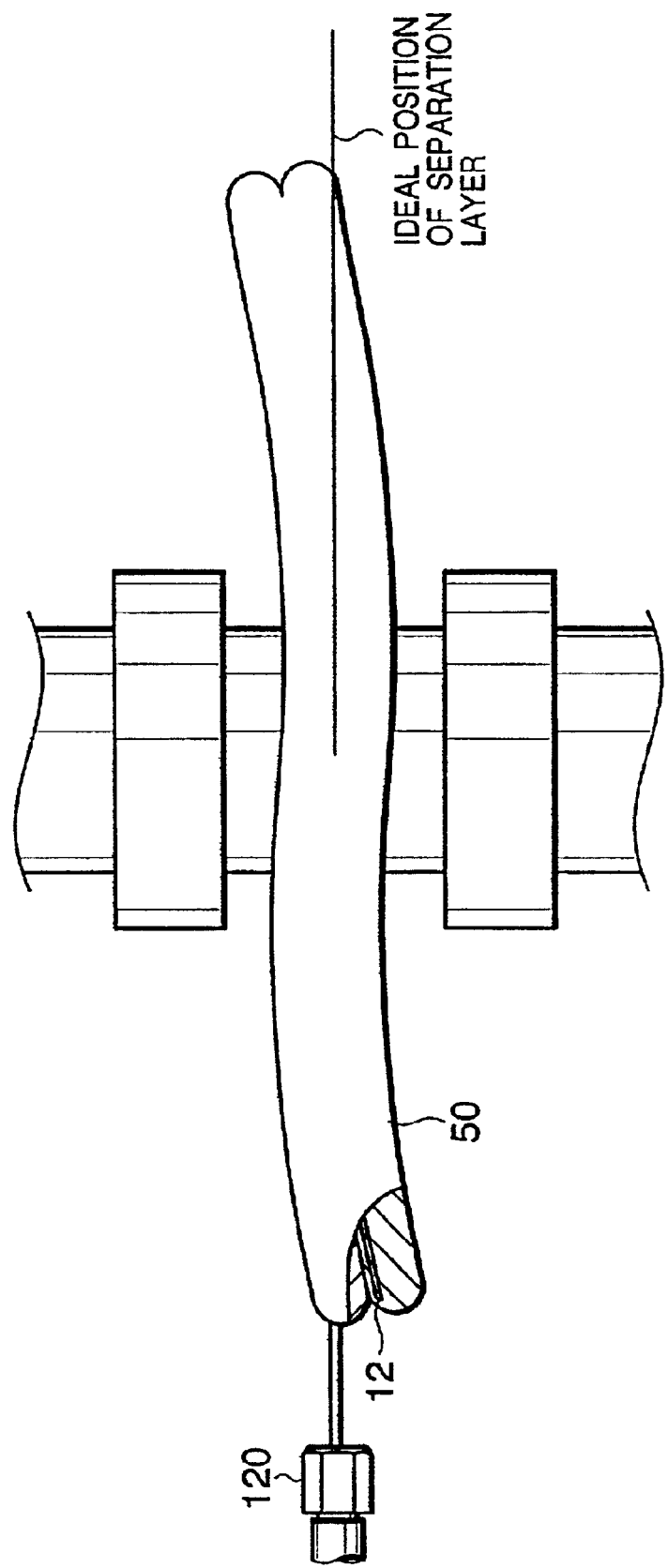
FIG. 13 is a view showing a state wherein a bonded substrate stack which is largely distorted is separated into two substrates at a porous layer.

An insulating film 61 is formed on the upper surface of the gate electrode and on the upper surfaces of the source and drain regions, which are converted into a silicide (FIG. 12D). As the material of the insulating film 61, silicon oxide containing phosphor and/or boron can be used.

Contact holes are formed in the insulating film 61 by CMP, as needed. When photolithography using a KrF excimer laser, ArF excimer laser, $F_2$ excimer laser, electron beam, or X-rays is used, a rectangular contact hole with aside smaller than 0.25 µm or a circular contact hole having a diameter smaller than 0.25 µm can be formed.

Next, the contact holes are filled with a conductor. To fill the contact holes with a conductor, a film of a refractory metal or a nitride thereof, which serves as a barrier metal 62, is formed on the inner surface of each contact hole, and after that, a conductor 63 such as a tungsten alloy, aluminum, aluminum alloy, copper, or copper alloy is deposited by CVD, PVD, or plating. A conductor may be deposited to a level higher than the upper surface of the insulating film 61 and removed by etch back or CMP. Alternatively, before the contact holes are filled with the conductor, the surface of the silicide layer in the source and drain regions, which is exposed to the bottom portion of each contact hole, may be nitrided. With the above process, a transistor such as an FET can be formed on the SOI layer, and a semiconductor device having a transistor with a structure shown in FIG. 12D can be obtained.

When the thickness and impurity concentration of the active layer (SOI layer) 13' are defined such that a depletion layer formed upon applying a voltage to the gate electrode reaches the upper surface of the buried insulating layer 14, the formed transistor operates as a fully depleted transistor. When the thickness and impurity concentration of the active layer (SOI layer) 13' are defined such that the depletion layer does not reach the upper surface of the buried insulating layer 14, the formed transistor operates as a partially depleted transistor.

According to the present invention, in separating a member which has a separation layer such as a bonded substrate stack, the member can be always separated appropriately regardless of some distortion in the member, insufficient accuracy in holding the member, or the like.

As many apparently widely different embodiments of the present invention can be made without departing from the spirit and scope thereof, it is to be understood that the invention is not limited to the specific embodiments thereof except as defined in the claims.

What is claimed is:

1. A method of separating a member which has a separation layer inside using a jet, comprising the control step of, halfway through separation processing of the member, changing a positional relationship between a jet orbit and the member in accordance with a program which is set in advance before start of the separation processing.

2. The method according to claim 1, wherein in the control step, the positional relationship between the jet orbit and the member is changed stepwise in accordance with the program.

3. The method according to claim 1, wherein the program is a single program which is set in advance to apply to separation of a plurality of members.

4. The method according to claim 1, wherein in the control step, the jet orbit or a position of the member is changed in a direction perpendicular to the separation layer of the member halfway through the separation processing.

5. The method according to claim 1, wherein in the control step, a direction of the jet is changed halfway through the separation processing.

6. The method according to claim 1, wherein in the control step, the positional relationship between the jet orbit and the member is changed halfway through the separation processing by switching an ejecting portion out of a plurality of ejecting portions, which is used to inject a fluid into the member.

7. The method according to claim 1, wherein the member has a recessed portion in an outer side of the separation layer and has a distortion within a predetermined range, and
in the control step, the positional relationship between the jet orbit and the member is so changed halfway through the separation processing as to inject a fluid into the recessed portion almost throughout a perimeter of the recessed portion before the separation processing is complete.

8. The method according to claim 1, wherein the member has a recessed portion in an outer side of the separation layer and has a distortion within a predetermined range, and
in the control step, a change in the positional relationship between the jet orbit and the member is repeated until the jet is injected into the recessed portion almost throughout a perimeter of the recessed portion.

9. The method according to claim 8, wherein the control step comprises the step of fixing the positional relationship between the jet orbit and the member after the jet strikes on the recessed portion almost throughout the perimeter of the recessed portion.

10. The method according to claim 1, wherein the member is rotated about an axis perpendicular to the separation layer during the separation processing.

11. The method according to claim 1, wherein the member comprises a bonded substrate stack obtained by bonding to a handle substrate a seed substrate which has a semiconductor layer on a separation layer through an insulating layer.

12. The method according to claim 1, wherein the jet is obtained by ejecting a liquid or gas from an ejecting portion.

13. An apparatus for separating a member which has a separation layer inside using a jet, comprising:
a holding portion for holding a member;
an ejecting nozzle for forming jets; and
a controller for changing, halfway through separation processing of the member held by said holding portion, a positional relationship between an orbit of the jet and the member in accordance with a program which is set in advance.

14. The apparatus according to claim 13, wherein said controller changes the positional relationship between the jet orbit and the member stepwise in accordance with the program.

15. The apparatus according to claim 13, wherein the program is a single program which is set in advance to apply to separation of a plurality of members.

16. The apparatus according to claim 13, wherein said controller changes the jet orbit or a position of the member in a direction perpendicular to the separation layer of the member halfway through the separation processing.

17. The apparatus according to claim 13, wherein said controller changes a direction of the jet halfway through the separation processing.

18. The apparatus according to claim 13, wherein said controller changes the positional relationship between the jet orbit and the member halfway through the separation processing by switching an ejecting portion out of a plurality of ejecting portions, which is used to inject a fluid into the member.

19. The apparatus according to claim 13, wherein the member has a recessed portion in an outer side of the separation layer and has a distortion within a predetermined range, and
said controller so changes the positional relationship between the jet orbit and the member halfway through the separation processing as to inject the fluid into the recessed portion almost throughout a perimeter of the recessed portion before the separation processing is complete.

20. The apparatus according to claim 13, wherein the member has a recessed portion in an outer side of the separation layer and has a distortion within a predetermined range, and
said controller repeats a change in the positional relationship between the jet orbit and the member until the jet is injected into the recessed portion almost throughout the perimeter of the recessed portion.

21. The apparatus according to claim 20, wherein said controller fixes the positional relationship between the jet orbit and the member after the jet is injected into the recessed portion almost throughout the perimeter of the recessed portion.

22. The apparatus according to claim 13, further comprising a rotating mechanism for rotating the member about an axis perpendicular to the separation layer during the separation processing.

23. The apparatus according to claim 13, wherein the member comprises a bonded substrate stack obtained by bonding to a handle substrate a seed substrate which has a semiconductor layer on a separation layer through an insulating layer.

24. The apparatus according to claim 13, wherein the jet is obtained by ejecting a liquid or gas from an ejecting portion.

25. A semiconductor substrate manufacturing method comprising the steps of:
forming a bonded substrate stack as a member to be separated by bonding to a second substrate a first substrate which has a separation layer inside and a transfer layer on the separation layer; and
separating the bonded substrate stack at the separation layer by using the separating method of claim 1.

26. A semiconductor device manufacturing method comprising the steps of:
preparing an SOI substrate manufactured using the manufacturing method of claim 25; and
element-isolating an SOI layer of the SOI substrate and forming a transistor on the element-isolated SOI layer.

27. The method according to claim 26, wherein the transistor is a partially depleted FET.

28. The method according to claim 26, wherein the transistor is a fully depleted FET.

29. A method of separating a member which has a separation layer inside using a jet, wherein separation is performed using an orbit of a first jet and an orbit of a second jet which are set in advance before separation processing and have positions different from each other in a direction of thickness of the member.

* * * * *